United States Patent
Inoue et al.

(10) Patent No.: US 7,993,820 B2
(45) Date of Patent: Aug. 9, 2011

(54) PATTERN MANUFACTURING EQUIPMENTS, ORGANIC THIN-FILM TRANSISTORS AND MANUFACTURING METHODS FOR ORGANIC THIN-FILM TRANSISTOR

(75) Inventors: Tomohiro Inoue, Tsukuba (JP);
Masahiko Ando, Hitachinaka (JP);
Shuji Imazeki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 854 days.

(21) Appl. No.: 11/775,896

(22) Filed: Jul. 11, 2007

(65) Prior Publication Data

US 2008/0012013 A1 Jan. 17, 2008

(30) Foreign Application Priority Data

Jul. 11, 2006 (JP) ................................. 2006-189944

(51) Int. Cl.
*G03F 1/00* (2006.01)
(52) U.S. Cl. ............. 430/325; 430/5; 430/9; 430/270.1; 430/302; 430/303; 403/326; 118/211; 118/624; 438/907; 438/908; 438/909; 438/913; 347/5; 347/19
(58) Field of Classification Search .............. 430/9, 302, 430/303, 325, 326, 5, 270.1; 438/913, 907, 438/909, 759–794, 270, 908; 347/19, 5; 118/211, 624
See application file for complete search history.

(56) References Cited

U.S. PATENT DOCUMENTS

| | | | |
|---|---|---|---|
| 6,568,243 B1 * | 5/2003 | Honma | 73/9 |
| 6,828,582 B1 | 12/2004 | Ando et al. | |
| 6,919,158 B2 * | 7/2005 | Kawamura et al. | 430/270.1 |
| 7,037,161 B2 * | 5/2006 | Yamanaka | 445/49 |
| 7,114,802 B2 * | 10/2006 | Kiguchi et al. | 347/101 |
| 2004/0228964 A1 * | 11/2004 | Ito et al. | 427/64 |
| 2005/0051770 A1 * | 3/2005 | Ando et al. | 257/40 |
| 2005/0257738 A1 * | 11/2005 | Tateishi et al. | 118/300 |
| 2006/0055722 A1 * | 3/2006 | Hirai et al. | 347/19 |
| 2006/0187253 A1 * | 8/2006 | Sato et al. | 347/15 |

FOREIGN PATENT DOCUMENTS

| | | |
|---|---|---|
| JP | 2003121384 | 4/2003 |
| JP | 2004319897 | 11/2004 |
| JP | 2005079560 | 3/2005 |
| KR | 2005-11124 | 1/2005 |

OTHER PUBLICATIONS

Korean Office Action dated Jun. 23, 2008.
Office Action in Taiwan Patent Application 096119142, mailed Aug. 5, 2010, (pp. 1-6).

* cited by examiner

*Primary Examiner* — Lynne A Gurley
*Assistant Examiner* — Yosef Gebreyesus
(74) *Attorney, Agent, or Firm* — Antonelli, Terry, Stout & Kraus, LLP.

(57) ABSTRACT

A liquid film applicator means can apply a photosensitive lyophobic film 18 to a substrate 16. An exposure unit 10 is placed on the back side of the substrate and forms the lyophobic film applied on the substrate into a pattern in alignment with gate electrodes 13. A dropping unit 55 drops a test liquid to a surface of the substrate having a pattern of the lyophobic film formed by the exposure means. A measuring means 58 detects the droplet dropped by the dropping unit. A determining means determines whether the pattern of the lyophobic film formed by the exposure means is proper or not based on the droplet detected by the detecting means.

2 Claims, 6 Drawing Sheets

PATTERN MANUFACTURING EQUIPMENTS, ORGANIC THIN-FILM TRANSISTORS AND MANUFACTURING METHODS FOR ORGANIC THIN-FILM TRANSISTOR

FIELD OF THE INVENTION

The present invention relates to a pattern manufacturing equipment for manufacturing a pattern on a substrate, an organic thin-film transistor and a manufacturing method for an organic thin-film transistor.

BACKGROUND OF THE INVENTION

An exemplary method for manufacturing an organic thin-film transistor in the related art has been described in JP-A-2005-79560. In the described pattern manufacturing method for providing a source electrode and a drain electrode in an organic thin-film transistor with high accuracy, a substrate is covered with a lyophobic film and a gate electrode is used as a mask to apply ultraviolet (UV) radiation or radiated light to the back of the gate electrode. The lyophobic film is thus vaporized and removed except the area masked by the gate electrode to form a pattern on the substrate. The source electrode and the drain electrode are formed in the area where the lyophobic film was removed.

JP-A-2004-319897 has disclosed a method in which a lyophobic film is applied onto a substrate, a photomask formed in a predetermined pattern is placed on the lyophobic film, and ultraviolet radiation or electron beams are radiated to the lyophobic film. The lyophobic film is decomposed, vaporized and removed by the ultraviolet radiation or electron beams and then a lyophilic portion is formed in the substrate to which the ultraviolet radiation or electron beams are applied, except the portion covered with the photomask.

On the other hand, an exemplary method for testing a wet pattern formed on a surface of a substrate has been described in JP-A-2003-121384. The described method includes forming a lyophobic pattern having a little wettability of a liquid on a substrate and a lyophilic pattern having high wettability of a liquid on the substrate. Then, a test liquid is attached to the surface of the lyophilic pattern, light is applied to the attached test liquid, and the light reflected by the test liquid and the light transmitted through the test liquid are analyzed to examine the lyophilic area on the substrate surface, thereby detecting any defect in the wet pattern.

BRIEF SUMMARY OF THE INVENTION

The pattern manufacturing method described in JP-A-2005-79560 is a so-called SALSA (self alignment and self assembly) method in which the gate electrode is used for the pattern manufacturing to eliminate the need for a new positioning means, and thus high accuracy is advantageously provided in positioning. The lyophobic film in the area covered with the gate electrode is left even after the ultraviolet radiation or the like is applied to the back thereof, while the lyophobic film in the area exposed to the ultraviolet radiation or the like is removed.

The lyophobic film, however, is transparent and thin, so that it is not easy to make a distinction between the area where the lyophobic film is left and the area where the lyophobic film was removed. In addition, when a pattern manufacturing method similar to that described in JP-A-2005-79560 was used, the present applicants found that application of ultraviolet radiation or the like to the lyophobic film for more than an appropriate time period or longer caused a problem in which the lyophobic film was removed in the area masked by a gate electrode due to diffraction of light or the like.

In other words, the method described in JP-A-2005-79560 cannot provide a predetermined pattern unless proper exposure time periods according to various materials are used. However, the proper exposure time periods have not been considered sufficiently in JP-A-2005-79560. Thus, the use of a deteriorated material or a faulty exposure apparatus may lead to the resulting wet pattern different from a designed pattern.

JP-A-2004-319897 has an advantage that the substrate does not need to be transparent since the photomask can be used to apply ultraviolet radiation or electron beams from above the lyophobic film similarly to JP-A-2005-79560. However, the method described in JP-A-2004-319897 cannot provide a predetermined pattern unless a proper exposure time is used. In addition, the pattern manufacturing method requires a separate means for positioning.

In the method for testing a wet pattern described in JP-A-2003-121384, the test liquid is attached only to the lyophilic area and is observed. As a result, the pattern in the lyophilic area can be examined, but it is difficult to detect the lyophobic property or defect in the lyophobic film. If any defect is overlooked and the subsequent steps are continued in the method, those steps may be wasted in the end to reduce the yield in substrate manufacturing. In addition, since the wettability is examined after the lyophilic pattern and the lyophobic pattern are formed, it is necessary to remove the wet pattern film and apply a new film after any defect is detected.

The present invention has been made in view of the above-mentioned problems in the related art, and it is an object thereof to improve the productivity of an organic thin-film transistor. It is another object of the present invention to improve the reliability of an organic thin-film transistor by manufacturing a stable wet pattern on a substrate. It is still another object of the present invention to test a pattern manufactured on a substrate easily and reliably.

Other objects, features and advantages of the invention will become apparent from the following description of the embodiments of the invention taken in conjunction with the accompanying drawings.

DESCRIPTION OF REFERENCE NUMERALS

Figure 1:
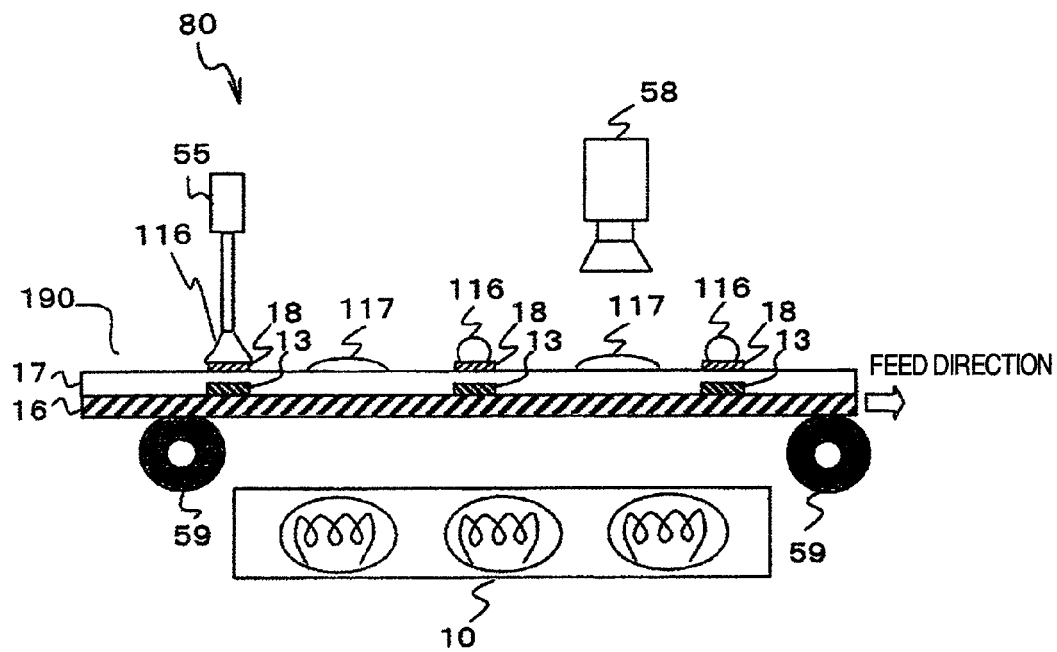
FIG. 1 is a schematic diagram showing an example of a pattern manufacturing equipment according to the present invention.

1 ORGANIC THIN-FILM TRANSISTOR
10 EXPOSURE UNIT

12 SEMICONDUCTOR LAYER
13 GATE ELECTRODE
14 SOURCE ELECTRODE
15 DRAIN ELECTRODE
16 SUBSTRATE
17 GATE INSULATOR
55 DISPENSER (DROPPING UNIT)
114-117 DROPLET

DETAILED DESCRIPTION OF THE INVENTION

According to an aspect, the present invention provides a pattern manufacturing equipment for manufacturing a pattern in a transparent substrate having a pattern of a number of identical gate electrodes formed regularly thereon, including a lyophobic film applicator means for applying a lyophobic film to the substrate, an exposure means placed on the back of the substrate for forming the lyophobic film applied on the substrate into a pattern in alignment with the pattern of the gate electrodes, a liquid dropping means for dropping a test liquid to a surface of the substrate having the pattern of the lyophobic film formed by the exposure means, a measuring means for detecting a droplet dropped by the liquid dropping means, and a determining means for determining whether the pattern of the lyophobic film formed by the exposure means is proper or not based on the droplet detected by the detecting means.

It is desirable to include an applicator means for exclusively applying a source electrode and a drain electrode to portions without forming the lyophobic film on the substrate after formations of the pattern of the lyophobic film by the exposure means.

According to another aspect, the present invention provides an organic thin-film transistor including a transparent substrate, a gate electrode formed on a surface of the transparent substrate, a gate insulator formed to cover the gate electrode and the transparent substrate, a source electrode and a drain electrode exclusively formed at a position on a surface of the gate insulator, the position being not on the upper surface of the gate electrode, and a semiconductor layer formed to connect a surface at an end of the source electrode and a surface at an end of the drain electrode to the surface of the gate insulator corresponding to the gate electrode. The semiconductor layer is provided by forming a pattern of a lyophobic film in alignment with the gate electrode on the surface of the gate insulator and then by removing the lyophobic film, and the pattern of the lyophobic film is formed to have substantially the same width as the width of the gate electrode.

According to yet another aspect, the present invention provides a manufacturing method for an organic thin-film transistor, including the steps of a gate electrode manufacturing step of manufacturing a pattern of a number of identical gate electrodes regularly on a transparent substrate, a gate insulator manufacturing step of manufacturing a gate insulator on a surface of the gate electrode and a surface of the substrate, a lyophilic/lyophobic pattern manufacturing step of applying a lyophobic film to a surface of the gate electrode and forming a pattern of the lyophobic film in alignment with the pattern of the gate electrodes by light from the exposure means provided on the back of the substrate, a source/drain electrode manufacturing step of exclusively applying a source electrode and a drain electrode to a portion of the pattern of the lyophobic film in alignment with the gate electrode, the portion having no lyophobic film, and a semiconductor layer manufacturing step of removing the lyophobic film remaining on the substrate and manufacturing a semiconductor layer connecting the portion where the lyophobic film has been removed to the source electrode and the drain electrode. The lyophilic/lyophobic pattern manufacturing step includes dropping a test liquid to the surface of the substrate during the formation of the pattern of the lyophobic film by the exposure means, detecting a droplet of the test liquid to determine the size thereof, and determining whether the pattern of the lyophobic film formed by the exposure means is proper or not based on the determined droplet diameter.

According to still another aspect, the present invention provides a pattern manufacturing equipment including a lyophobic film manufacturing means for forming a lyophobic film having wettability on a surface of a transparent substrate, a removing means for partially removing the lyophobic film from the surface of the substrate, a droplet dropping means for dropping a test liquid to the surface of the substrate from which the lyophobic film has been partially removed, and a measuring means for detecting the diameter of the dropped droplet.

It is preferable to include an electrode pattern manufacturing means for forming a gate electrode on the substrate prior to the formation of the lyophobic film on the substrate. It is desirable that the droplet dropping means for dropping the test liquid includes a control means for performing control such that the test liquid is dropped to both of a lyophobic area where the lyophobic film remains and a lyophilic area where the lyophobic film has been removed.

The removing means preferably includes exposure means for applying light energy to the substrate. It is preferable that the droplet dropping means for dropping the test liquid is located on the front side of the substrate, the exposure means is located on the back side of the substrate, and the light energy is applied to the lyophobic film applied on the substrate from the back side of the substrate to partially remove the lyophobic film. The measuring means is preferably located on the front side of the substrate. The droplet dropping means and the measuring means may be movable within an exposure range of the exposure means.

According to the present invention, the test liquid is continuously observed from above the substrate during the removal of the lyophobic film applied on the substrate in the pattern manufacturing step in which the lyophobic film is removed, so that the productivity of the organic thin-film transistor is improved. The stable wet pattern is formed on the substrate to enhance the reliability of the organic thin-film transistor. In addition, since the test liquid is detected from above the substrate, the pattern formed on the substrate can be tested easily and reliably.

Figure 7:
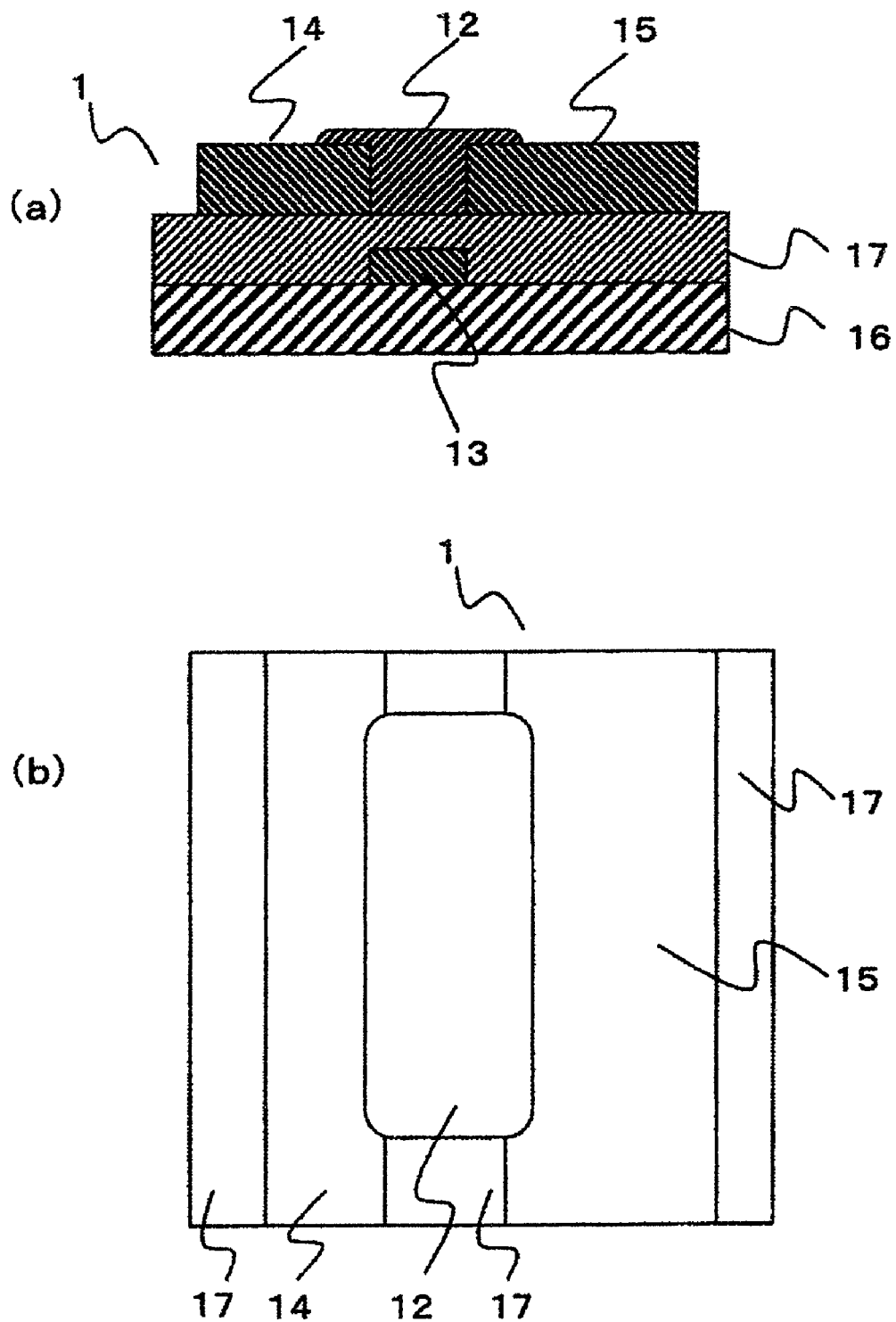
FIGS. 7(a) and 7(b) are a longitudinal sectional view and a plan view showing an example of the organic thin-film transistor according to the present invention.

Examples of a pattern manufacturing equipment and a pattern manufacturing method according to the present invention will hereinafter be described with reference to the accompanying drawings. FIGS. 7(a) and 7(b) show an example of an organic thin-film transistor (TFT) manufactured by a pattern manufacturing equipment according to the present invention. FIG. 7(a) is a longitudinal sectional view and FIG. 7(b) is a top view. An organic thin-film transistor 1 includes a transparent substrate 16, a gate electrode 13 placed thereon, and a gate insulator 17 covering an upper surface of the substrate 16 including the gate electrode 13 thereon.

A semiconductor layer 12 is provided on an upper surface of the gate insulator 17 and a position corresponding to above the gate electrode 13. A drain electrode 15 and a source electrode 14 are exclusively provided on the upper surface of the gate insulator 17 except the area where the semiconductor layer 12 is provided. A portion of the drain electrode 15 and a portion of the source electrode 14 are covered with the semiconductor layer 12. The bottom surface of the single organic thin-film transistor 1 typically has a length of 0.1 to 0.3 mm in the horizontal direction and a length of 0.1 to 0.3 mm in the vertical direction in FIG. 7(*b*). The gate electrode 13 has a width of approximately 5 to 50 μm. The gate electrode 13 has a thickness of 400 nm, the gate insulator 17 has a thickness of 300 nm, and each of the drain electrode 15, the source electrode 14 and the semiconductor layer 12 has a thickness of approximately 0.1 μm.

Figure 2:
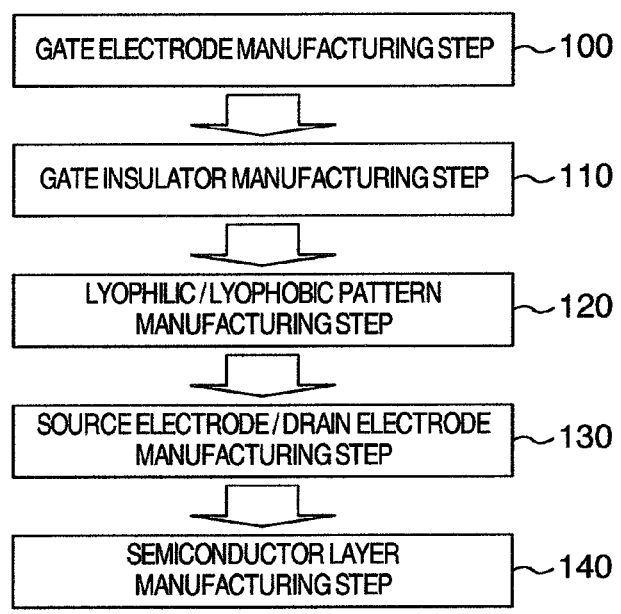
FIG. 2 is a flow chart explaining steps of manufacturing an organic thin-film transistor according to the present invention.
Figure 3:
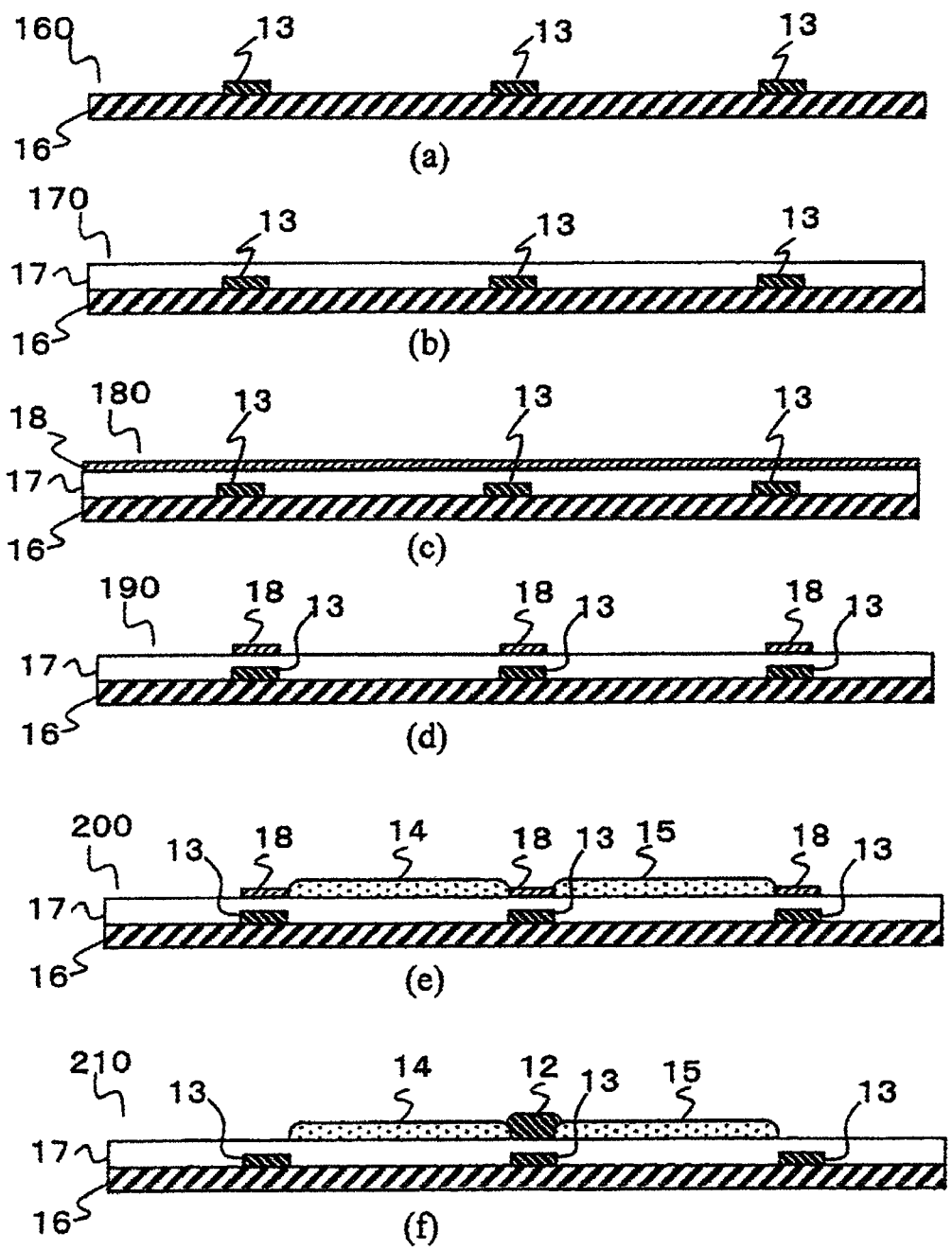
FIGS. 3(a) to 3(f) are longitudinal sectional views showing an organic thin-film transistor at the respective steps shown in FIG. 2.

FIG. 2 is a flow chart showing the manufacturing process in an example of the organic thin-film transistor 1 according to the present invention. FIGS. 3(*a*) to 3(*f*) are longitudinal sectional views showing the organic thin-film transistor 1 at the respective steps shown in FIG. 2. The manufacturing process of the organic thin-film transistor 1 is broadly classified into a gate electrode manufacturing step 100, a gate insulator manufacturing step 110, a lyophilic/lyophobic pattern manufacturing step 120, a source electrode/drain electrode manufacturing step 130 and a semiconductor layer manufacturing step 140 which are performed in order. The details of each of the manufacturing steps will hereinafter be described.

[Gate Electrode Manufacturing Step 100]

FIG. 3(*a*) is a longitudinal sectional view showing a substrate 160 provided by performing the gate electrode manufacturing step 100. The substrate 160 has a size of 150 mm in a feed direction and 150 mm in a width direction in order to manufacture 300 organic thin-film transistors each in the feed direction and the width direction of the substrate 160. The substrate 160 includes an insulating substrate 16 made of transparent material such as quartz glass in the lowest layer. Gate electrodes 13 having a predetermined pattern are formed regularly in the feed direction and the width direction on an upper surface of the insulating substrate 16. In the following description, the surface of the insulating substrate 16 having the gate electrodes 13 formed thereon is referred to as a front side and the surface opposite thereto is referred to as a back side. The gate electrodes 13 are made of chromium thin film having a thickness of 300 nm and are formed by depositing chromium on the front side of the insulating substrate 16 through sputtering and then patterning the chromium as desired through photolithography.

[Gate Insulator Manufacturing Step 110]

FIG. 3(*b*) is a longitudinal sectional view showing a substrate 170 provided by performing the gate insulator manufacturing step 110 for manufacturing the gate insulator 17 on the substrate 160 manufactured at the gate electrode manufacturing step 110. Oxide silicon is deposited through CVD on the front sides of the substrate 160 and the gate electrode 13 to form the gate insulator 17. The gate insulator 17 has a thickness of 300 nm.

[Lyophilic/Lyophobic Pattern Manufacturing Step 120]

FIG. 3(*c*) is a longitudinal sectional view showing a substrate 180 at an immediate substep in the lyophilic/lyophobic manufacturing step 120 for forming a lyophilic pattern and a lyophobic pattern on the front side of the substrate 170 having the gate insulator 17 deposited thereon. FIG. 3(*d*) is a longitudinal sectional view showing a substrate 190 provided after the lyophilic/lyophobic manufacturing step is performed.

A photosensitive lyophobic film 18 is formed on the surface of the gate insulator 17 formed in the substrate 170 to provide the substrate 180. The photosensitive lyophobic film 18 is formed by applying a solution containing lyophobic unimolecules dispersed in a fluoride solvent before drying. The lyophobic unimolecules dispersed in the fluoride solvent are an alkyl fluoride silane coupling agent including a carbon chain, at least part of the chain being terminated at a fluoride group, such as $CF_3(CF_2)_7(CH)_2SiCl_3$. In the example, it was found that the contact angle of water on the photosensitive lyophobic film 18 was 100 to 120 degrees and the manufactured photosensitive lyophobic film 18 represented a desired lyophobic property.

Exposure of the photosensitive lyophobic film 18 to ultraviolet radiation causes decomposition and vaporization to remove the photosensitive lyophobic film 18. The gate insulator 17 is exposed in the portion where the photosensitive lyophobic film 18 was removed. Thus, the ultraviolet radiation is applied to the back side of the substrate 180 to form an exposed area where the photosensitive lyophobic film 18 was removed and a non-exposed area where the ultraviolet radiation is shielded by the gate electrode 13 to leave a photosensitive lyophobic film 18. In this manner, the photosensitive lyophobic film 18 having substantially the same pattern as that of the gate electrode 13 is provided. This results in the substrate 190 having the lyophilic pattern and the lyophobic pattern with different wettability. It was found that the contact angle of water on the gate insulator 17 was 20 degrees or less, and thus a desired lyophilic property was achieved in the substrate 190.

The gate electrode 13 is used as a mask to form the pattern of the lyophobic film 18 similar to the pattern of the gate electrode 13 in the substrate 190. However, it is difficult to determine whether the pattern of the lyophobic film 18 is substantially the same as the patter of the gate electrode 13 since the lyophobic film 18 is thin and transparent, and the underlying gate insulator 17 is also transparent. In addition, even when they appear to be identical, a portion of the pattern of the lyophobic film 18 may be narrower than a predetermined width or may be broken on the way. Thus, it is necessary to examine whether the lyophobic film 18 has the predetermined pattern.

Figure 6:
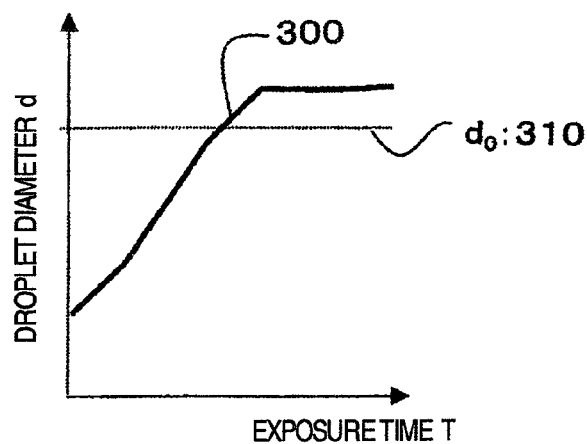
FIG. 6 is a graph for explaining a relationship between an exposure time and a droplet diameter on a substrate.

FIG. 6 shows how the photosensitive lyophobic film 18 applied onto the gate insulator 17 is changed with an exposure time in a relationship between an exposure time T and a droplet diameter d when a fixed amount of droplet, a droplet of water in this case, is dropped. This is the result of dropping the droplet to a portion where the gate electrode 13 is not formed and the photosensitive lyophobic film 18 is applied. A solid line 300 represents the relationship between the exposure time T and the droplet diameter d when exposure is performed at a predetermined intensity. With the exposure time T, the droplet becomes more wettable (lyophilic) to increase the droplet diameter d. After the elapse of a sufficient exposure time, the photosensitive lyophobic film 18 is removed and the droplet diameter is substantially constant.

The intensity of the ultraviolet radiation applied to the photosensitive lyophobic film 18 depends on the states of the substrate 16 and the gate insulator 17. To check the appropriate progress of the acquisition of the lyophilic property in a predetermined time period, the droplets are dropped from above the substrate 180 during the manufacturing of the pattern of the lyophobic film 18 through the ultraviolet radiation. The diameters of the dropped droplets are measured successively. A pattern manufacturing equipment capable of the measurement of droplet diameters will hereinafter be described with reference to FIGS. 1 and 4.

Figure 4:
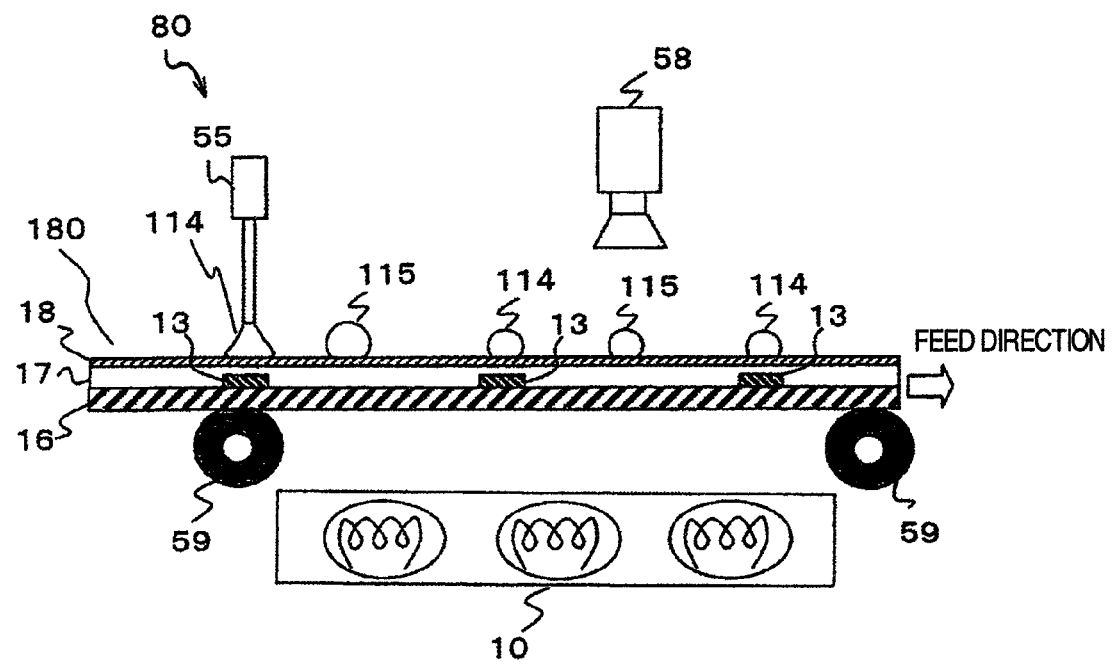
FIG. 4 is a schematic diagram for explaining how to manufacture a pattern on a substrate.

FIGS. 1 and 4 are schematic diagrams showing the main portions of the pattern manufacturing equipment. A pattern manufacturing equipment 80 is used in patterning (FIG. 1) for manufacturing a lyophilic pattern and a lyophobic pattern by removing part of the photosensitive lyophobic film 18 and in test (FIG. 4) for testing the deposition of the photosensitive lyophobic film 18.

The pattern manufacturing equipment 80 includes an exposure unit 10 with a low-pressure mercury vapor lamp below the substrate 180 or 190 in order to apply the ultraviolet radiation to the back side of the substrate 180 or 190. A pair of feed rollers 59 is placed at a position not interfering with the exposure unit 10 for putting the substrate 180 or 190 thereon, introducing the substrate 180 or 190 into the pattern manufacturing equipment 80, and transferring the substrate 180 or 190 to the facility for the next step. A dropping unit 55 drops droplets 114 to 117 for test to predetermined positions in accordance with the pattern of the gate electrode 13 on the substrate 180 or 190 fed by the feed rollers 59. A measuring means 58 measures the diameters of the droplets 114 to 117 for test.

To avoid interference of the manufacturing and the measurement of the organic thin-film transistor 1, a dummy organic thin-film transistor portion is formed on the periphery of the area where the organic thin-film transistor is formed instead of the direct measurement of the area of the substrate 180 or 190 where the organic thin-film transistor 1 is manufactured. The dummy organic thin-film transistor portion is used as a target of test of the photosensitive lyophobic film 18 in this example. The dummy organic thin-film transistor portion has dummy gate electrodes 13 in substantially the same pattern as that in the regular organic thin-film transistor 1. The ultraviolet radiation is also applied to the back of the dummy organic thin-film transistor portion.

The measuring means 58 includes a CCD camera which manipulates images of the droplets 114 to 117. The images are subjected to image processing to determine the droplet diameter D. Since the droplet diameter D relates to the wettability of the surface of the substrate 180 and 190, the wettability is evaluated on the basis of the previously calibrated relationship between the droplet diameter D and the wet angle. The CCD camera is movable so that it can take images of the droplets 114 to 117 dropped at arbitrary positions on the substrate 180 or 190. Thus, the CCD camera may be retracted from the exposure section other than when images are taken.

The test liquid dropping unit 55 may be formed of an apparatus which can drop a fixed amount of test liquid such as a dispenser and an inkjet. A dispenser is used in the example. The test liquid dropping unit 55 is movable so that it can drop the test liquid at arbitrary positions on the substrate 180 or 190 similarly to the CCD camera. The test liquid droplets 114 to 117 are preferably formed of a material having a lyophobic property of a contact angle of approximately 90 degrees or more for the photosensitive lyophobic film 18 and a lyophilic property of a contact angle of approximately 20 degrees or less for the gate insulator 17. In the example, the droplets 114 to 117 are realized by water produced with an ion-exchange resin.

The test liquid is dropped to the dummy organic thin-film transistor portion as descried above, thereby eliminating the need for the subsequent steps of cleaning and removing the test liquid. The feed rollers 59 are driven to feed the substrate 180 before exposure to the position where the exposure unit 10 performs exposure operation, wherein the substrate 180 is covered with the photosensitive lyophobic film 18. The feed rollers 59 also feed the substrate 190 to the next step after the exposure operation and the wettability evaluation with the test liquid are finished.

Figure 5:
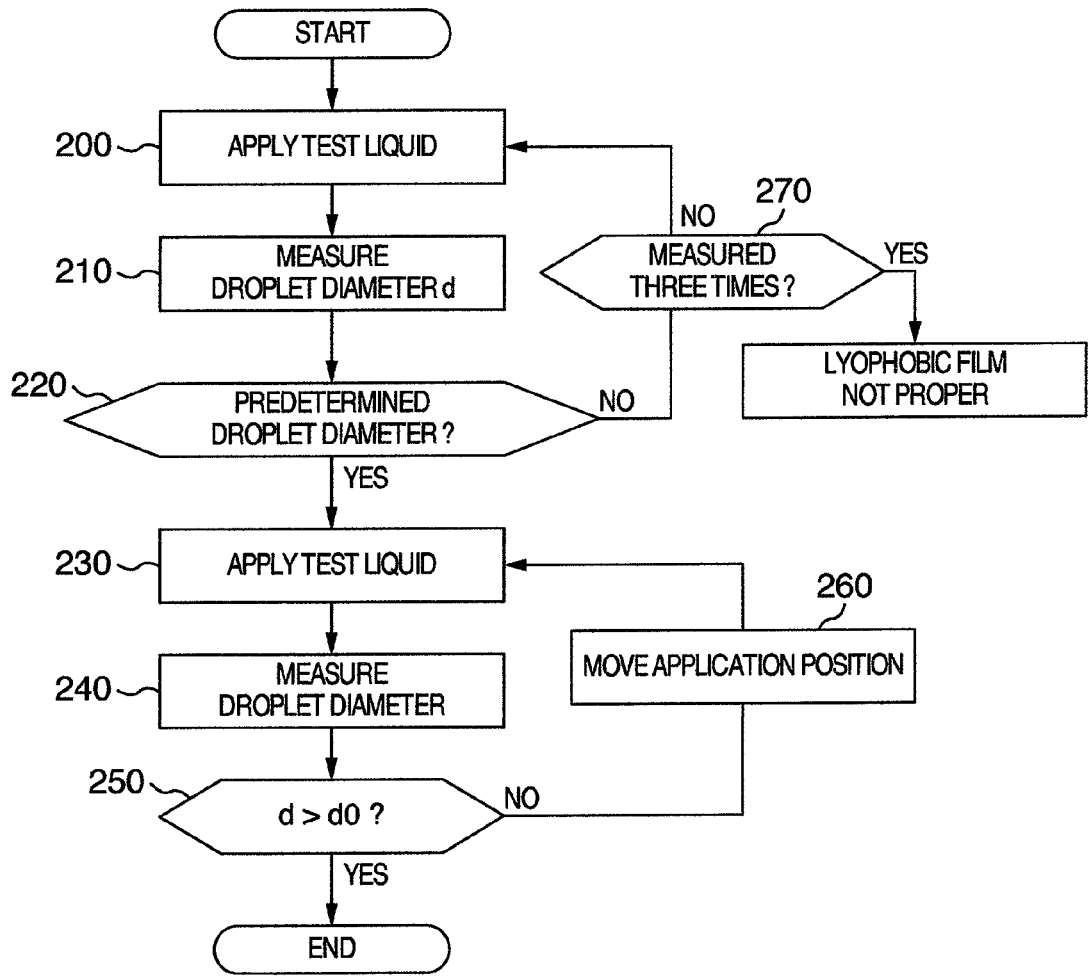
FIG. 5 is a flow chart explaining steps of manufacturing the organic thin-film transistor according to the present invention.

The detailed operation procedure in the pattern manufacturing equipment 80 will be described with reference to FIG. 5. Firstly, description will be made for the operation in a test for checking whether a proper film is used as the photosensitive lyophobic film 18. At a test liquid dropping step 200, the test liquid is dropped to the surface of the substrate 180 by the dispenser 55. A control means (which is not shown in the figure) performs control such that the droplet 114 is dropped to a non-exposure area masked by the previously formed dummy gate electrode 13a and the droplet 115 is dropped to an exposure area where the dummy gate electrode 13a is not formed. At a droplet diameter measuring step 210, the images of the droplets 114 and 115 on the substrate 180 are taken by the CCD camera and subjected to image processing by an image processing means (which is not shown in the figure) to determine the diameters of the droplets 114 and 115. The droplets 114 and 115 are dropped at a plurality of different positions (five or more different positions) to determine the average value and the standard deviation of the diameters through the image processing.

At a step 220, it is determined whether or not the average diameter and the standard deviation of the diameters of the droplets 114 and 115 are equal to predetermined values. If the average diameter of the droplets is equal to or higher than the predetermined value or if the standard deviation of the droplet diameters is equal to or higher than the predetermined value, the dropping position is changed and the flow returns to the dropping step 200 for dropping the test liquid again. If the steps are repeated several times (three times in the example) and the droplet diameters are still larger than the predetermined value and thus it is determined that the photosensitive lyophobic film 18 does not have a predetermined lyophobic property (step 280), it is determined that an error occurred at the previous step 100 or 110 shown in FIGS. 3(a) and 3(b) or in the manufacturing of the photosensitive lyophobic film 18, and the procedure is stopped at this point or the processing conditions are changed at those steps.

If it is determined that the photosensitive lyophobic film 18 has the predetermined lyophobic property, the flow moves to patterning operation. The exposure unit 10 performs exposure on the substrate 180 from the back side thereof to form the lyophilic pattern and the lyophobic pattern. After a predetermined time period has elapsed since the start of the exposure, the flow moves to a test liquid dropping step 230. As in the abovementioned test, the test is performed in the dummy organic thin-film transistor portion formed in the peripheral potion of the substrate. The droplet 116 is dropped to the non-exposure area formed by using the dummy gate electrode 13a as a mask, and the droplet 117 is dropped to the exposure area where the ultraviolet radiation is performed.

The diameters of the dropped droplets 116 and 117 are measured at a droplet diameter measuring step 240. Since the photosensitive lyophobic film 18 used in the example acquires the lyophilic property after the ultraviolet radiation for approximately six minutes, the test liquid is dropped at intervals of 15 seconds after the start of the exposure. The diameters of the dropped droplets 116 and 117 are measured by the CCD camera (step 240). It is determined from the measured diameters of the droplets 116 and 117 whether the droplets 116 and 117 extend to a predetermined droplet diameter, that is, whether the photosensitive lyophobic film 18 is removed in a predetermined area of the substrate 180 through the exposure (step 250).

At the test steps from steps 230 to 250, the substrate 180 may be stopped temporarily in the exposure of the ultraviolet radiation, but the test operation is performed in parallel with the exposure processing to improve the processing efficiency at the step 120 for manufacturing the lyophilic pattern and the lyophobic pattern. At the droplet diameter measuring step 240, the images of the droplets 116 and 117 are taken by the CCD camera as described above, and then the droplet diameter d is calculated by a processing means (which is not shown in the figure). At the step 250, if the droplet diameter d of the droplet 117 is equal to or lower than a target value do, the exposure is continued since it is not sufficient. The dispenser 55 is moved to change the drop position of the test liquid at the step 260, and then the flow returns to the step 230 to drop the test liquid again to a different position.

Figure 8:
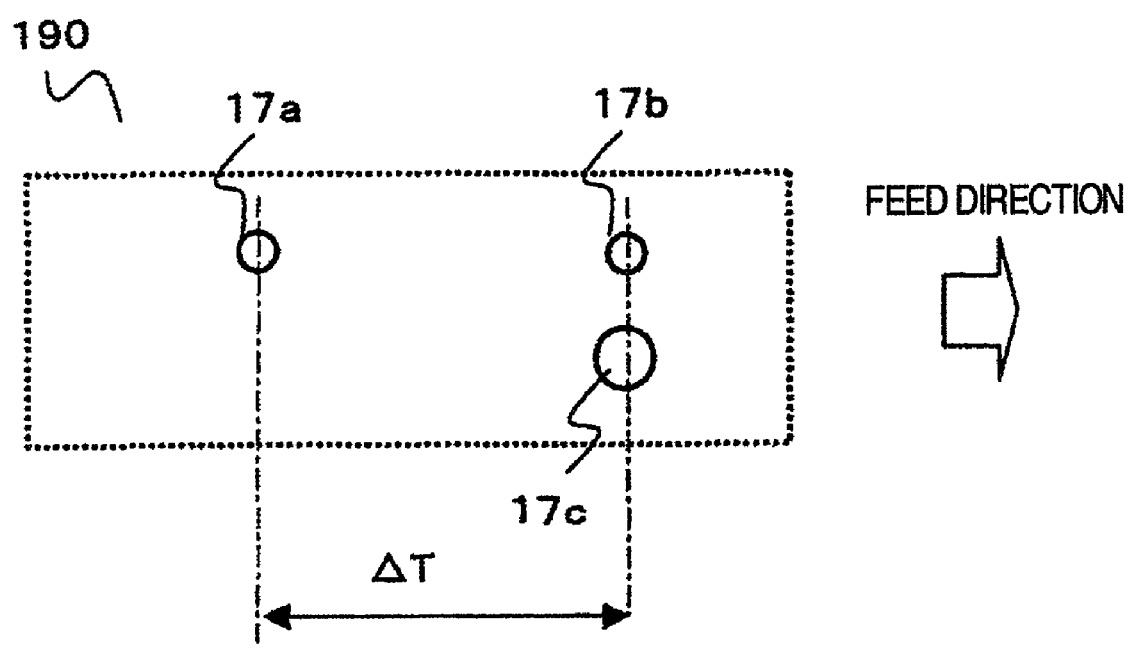
FIG. 8 is a schematic diagram for explaining the position of application of a test liquid.

The test liquid drop position moving step 260 will be described in more detail with reference to FIG. 8. In the example, the exposure is performed while the substrate 180 is fed at a predetermined rate. Instead of the exposure of the overall substrate 180, a portion of the substrate 180 having a predetermined width in the feed direction is exposed. Thus, in FIG. 8, a portion on the right has been exposed for a longer time period, while a portion on the left has been exposed for a shorter time period. In this case, if the droplet diameter of the test liquid is measured at the same position in the feed direction (position in the horizontal direction), the test when the exposure time is substantially the same time period can only be carried out.

Thus, the CCD camera is moved to the position in the feed direction where the previously tested position 17a reaches after the elapse of a time interval ΔT (15 seconds). However, the position in parallel with the position 17a corresponds to the previously measured position 17b, so that the droplet of the previous test liquid may affect the test. For this reason, a new measurement position 17c is set to a position a predetermined distance away from the position 17b in the vertical direction.

When the substrate 180 is stopped to exposure the ultraviolet radiation, the exposure time is uniform over the exposure areas corresponding to almost all areas of substrate 180. For this reason, the test liquid may be dropped anywhere. If the measured diameter d of the droplet 117 dropped in the exposure area extends to the target value do shown in the graph of FIG. 6, it is determined that the photosensitive lyophobic film 18 has the lyophilic property. Although omitted in FIG. 5, the steps 230 to 250 are repeated in order to test all of the test areas set on the substrate 180. After the test of all of the test areas, it is determined that the pattern has been formed. While only the droplet 117 in the lyophilic area is evaluated in the above description, the diameter of the droplet 116 in the lyophobic area is desirably evaluated. According to the example, the wettability changed with the exposure can be appropriately examined to form the lyophilic pattern and lyophobic pattern stably.

[Source/Drain Electrode Manufacturing Step 130]

After it is checked that the substrate 190 is provided by forming the pattern on the surface of the substrate 180, the drain electrode 15 and the source electrode 14 are exclusively formed in the lyophilic portion of the substrate 190. FIG. 3(e) is a longitudinal sectional view showing a substrate 200 including the drain electrode 15 and the source electrode 14 formed thereon. The drain electrode 15 and the source electrode 14 are formed by applying a conductive ink in a liquid state to the surface of the substrate 190 from which the photosensitive lyophobic film 18 was removed and then by fixing the conductive ink to the surface of the substrate 190 through calcination at approximately 200 degrees.

The conductive ink is realized by a liquid mainly containing at least one of metal particles, a metal complex, and a conductive polymer and showing a sufficiently low resistance value after the calcination. Specifically, it is possible to use a solution containing metal particles having a diameter of approximately 10 μm or less and mainly made of Au, Ag, Pd, pt, Cu, or Ni, or a metal complex dispersed in a solvent such as water, toluene, and xylene. It is also possible to use a solution such as PEDOT (poly(3,4-ethylene dioxythiophene)), polyannin, and polypyrrole provided by doping PSS (polystyrene sulfonate acid) which is a conductive polymer.

In the example, a liquid (metal ink) containing Ag dispersed in a solvent mainly made of water was used as the conductive ink. The conductive ink extends on the surface of the gate insulator 17 due to the lyophilic property, and is repelled by the photosensitive lyophobic film 18 which is lyophobic. The drain electrode 15 and the source electrode 14 are formed only in the lyophilic area in alignment with the gate electrode 13. When applying the conductive ink, it is preferable to use printing capable of application of a solution with a dispenser, an inkjet, or a spray. In the example, a dispenser capable of releasing a liquid by controlling pressure of a nozzle is used.

[Semiconductor Layer Manufacturing Step 210]

FIG. 3(f) is a longitudinal sectional view showing a substrate 210 provided by forming the semiconductor layer 12 in the remaining photosensitive lyophobic film 18 after it is checked that the drain electrode 15 and the source electrode 14 are formed in the substrate 200. At the semiconductor layer manufacturing step 140 shown in FIG. 2, the photosensitive lyophobic film 18 remaining at the position corresponding to the gate electrode 13 is removed by a low-pressure mercury lamp (which is not shown in the figure) which is placed on the front side of the substrate 200. Next, the semiconductor layer 12 is formed to cover a portion of the source electrode 14 and a portion of the drain electrode 15 mainly in the substrate surface 200 from which the photosensitive lyophobic film 18 was removed.

The semiconductor layer 12 is made of a material such as a conjugate polymer compound such as polyphenylenevinylene and polythiophene and an aromatic compound including a polyacene compound such as antracene, tetracene, and pentacene. In the example, a solution containing pentacene dissolved in a solvent such as toluene and trichlorobenzene was used. For applying the semiconductor layer 12 to the gate insulator 17, it is preferable to use printing capable of application of a solution with a dispenser, an inkjet, or a spray. In the example, a dispenser is used similarly to the source/drain electrode manufacturing step 130. In the application operation, the semiconductor solution is heated to approximately 150 to 200 degrees to maintain the solubility of the semiconductor material. After the semiconductor layer 12 is formed on the gate insulator 17, the organic thin-film transistor 1 of a bottom gate type is provided in the substrate 210.

While the rectangular glass substrate is used as the substrate in the example, a transparent film such as a plastic film may be used for the material of the substrate. In this case, it is also necessary to form a gate electrode not transparent in the substrate.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A pattern manufacturing equipment for manufacturing a pattern on a transparent substrate having a pattern of a number of identical gate electrodes formed regularly thereon, comprising:
    a lyophobic film applicator means for applying a lyophobic film on the transparent substrate;
    an exposure means placed on the back of the transparent substrate for forming the lyophobic film applied on the transparent substrate into a pattern in alignment with the pattern of the gate electrodes;
    a liquid dropping means for dropping a test liquid to form a first droplet of the test liquid on a surface of the lyophobic film formed by the exposure means and to drop a second droplet of the test liquid to a surface of the transparent substrate where the lyophobic film has been removed;

a measuring means for detecting diameters of the first and second droplets dropped by the liquid dropping means; and a determining means for determining whether the lyophobic film has been properly formed by the exposure means based on the diameter of the first droplet and for determining whether the lyophobic film has been removed from the surface of the transparent substrate by determining the diameter of the second droplet.

2. The pattern manufacturing equipment according to claim 1, further comprising an applicator means for exclusively applying a source electrode and a drain electrode to portions without forming the lyophobic film on the transparent substrate after formations of the pattern of the lyophobic film by the exposure means.

* * * * *